United States Patent [19]

Vandermark

[11] 3,804,320

[45] Apr. 16, 1974

[54] PACK EXTRACTOR

[75] Inventor: Harold F. Vandermark, Blue Bell, Pa.

[73] Assignee: Nu-Concept Computer Systems, Inc., Norristown, Pa.

[22] Filed: Sept. 13, 1972

[21] Appl. No.: 288,613

[52] U.S. Cl. .................... 228/19, 29/427, 219/230, 228/51

[51] Int. Cl. .................... B23k 1/00

[58] Field of Search .................... 228/19, 20, 51, 54; 219/228, 229, 230; 29/426, 427

[56] References Cited

UNITED STATES PATENTS

| | | | |
|---|---|---|---|
| 2,226,194 | 12/1940 | Berolsky | 228/51 |
| 3,230,338 | 1/1966 | Kawecki | 219/229 X |
| 3,529,760 | 9/1970 | Hickman et al. | 228/51 |
| 3,632,036 | 1/1972 | Halstead | 219/229 X |
| 3,632,972 | 1/1972 | Halstead | 228/19 X |
| 3,632,973 | 1/1972 | O'Keefe | 228/51 X |
| 3,649,809 | 3/1972 | Halstead | 228/19 X |

*Primary Examiner*—J. Spencer Overholser
*Assistant Examiner*—Robert J. Craig
*Attorney, Agent, or Firm*—Caesar, Rivise, Bernstein & Cohen

[57] ABSTRACT

A hand tool for extracting integrated circuit packs from printed circuit boards to which the pins of said pack have been soldered. The tool includes a pair of pivotable arms each of which carries an electrically heated tip. The tips include planar surfaces and hook means for clampingly engaging the pack therebetween, heating the pins of the pack to desolder them and extracting the pack once desoldered.

10 Claims, 6 Drawing Figures

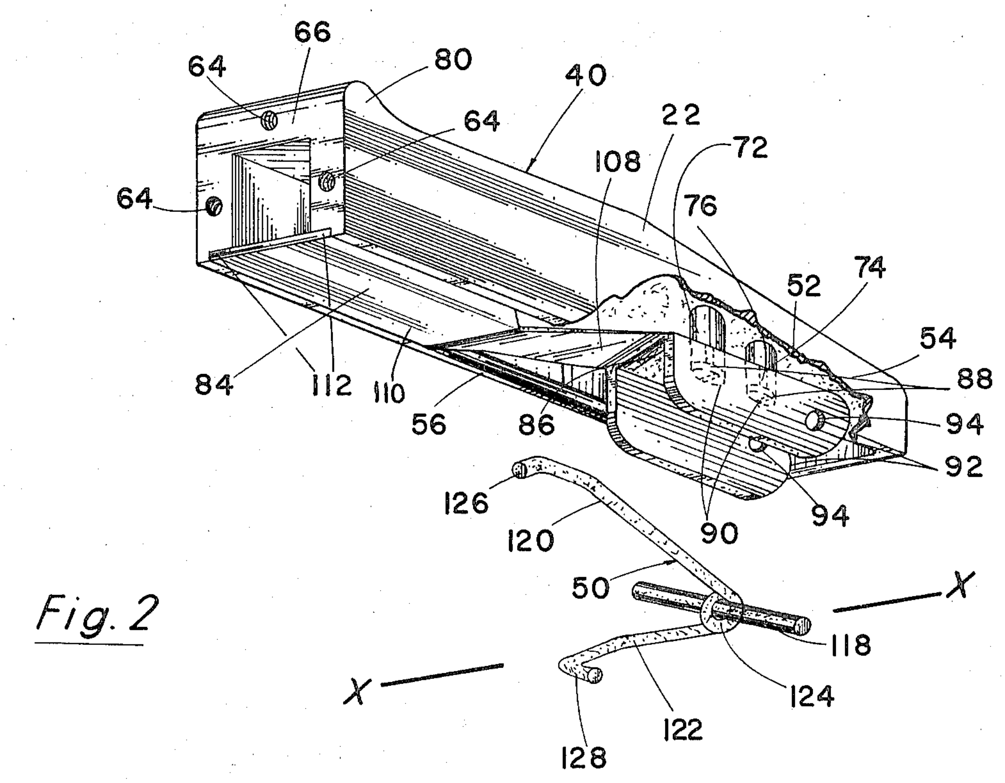
Fig. 2
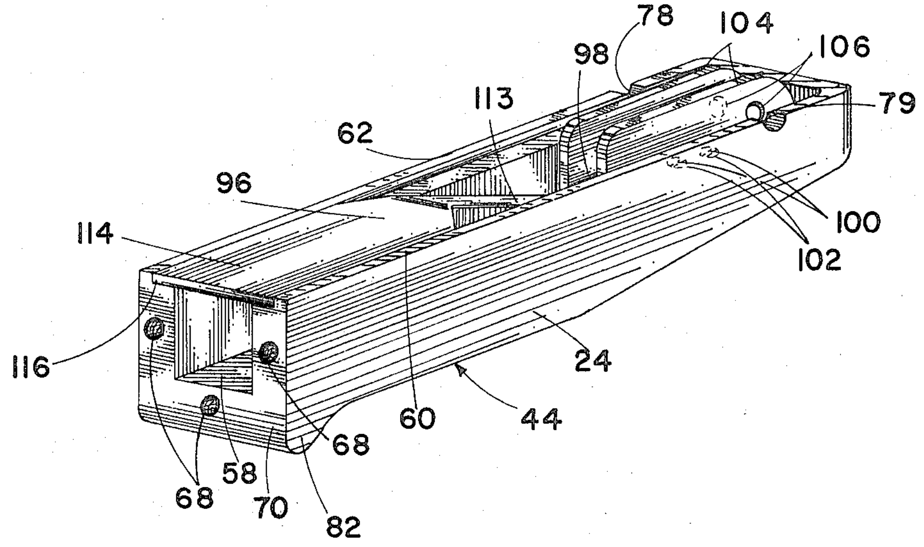

PACK EXTRACTOR

This invention relates generally to hand held tools and more particularly to hand held tools for desoldering and extracting integrated circuit packs from printed circuit boards.

With the advent of the integrated circuit chip, electronic circuits capable of performing multiple functions and including a large number of components and interconnections are etched onto a chip of semi-conductor material a few millimeters in cross-sectional area. Such chips are disposed within a very small hermetically sealed housing or pack which is typically rectangular in shape. A plurality of leads are connected to selected portions of the integrated circuit chip and are connected to respective pins which pass through selected sidewalls of the pack, normal to the plane thereof. The pins extend in that direction for a very short distance, e.g. one millimeter, and are then bent at right angles thereto so as to extend generally parallel to the plane of the sidewalls of the pack. The pins terminate slightly below the plane of the bottom of the pack.

Integrated circuit packs are normally mounted on printed circuit boards to electrically interconnect one with another or to electrically interconnect the pack to additional electronic or electrical circuitry.

As is known printed circuit boards include a plurality of conductors printed on an insulating material substrate.

The integrated packs are mounted on the circuit board and are connected to selected printed conductors thereof in the following manner: a plurality of holes are drilled in the board through selected conductors printed thereon. The integrated circuit pack is mounted on one side of the circuit board, with its pins extending through the holes therein, by soldering said pins to the printed circuit conductors contiguous with said holes on the other side of the board. When connected thusly, the bottom side of the pack is disposed slightly above the surface of the printed circuit board.

One common type of integrated circuit pack is known as a dual-in-line pack. Such packs include a plurality of pins exiting opposed longitudinal sides of the pack.

Occasionally it may be necessary to remove or extract a dual-in-line integrated circuit pack from the circuit board to which its pins are soldered. To that end each of the soldered pins of the pack must be desoldered from the associated printed conductor on the board and the pack removed as a unit before the solder resolidifies. In order to efficiently accomplish the extraction of the pack from the board, it is of considerable importance to uniformly heat all of the soldered pins without excessively heating the integrated circuit chip disposed within the pack. It is also of considerable importance not to deform the pins of the pack during the extraction process or enable the molten solder to spill over and short circuit adjacent printed conductors. The closer that the packs are disposed adjacent to one another the harder it is to remove a particular pack without affecting the soldered connections of an adjacent pack.

It is therefore a general object of this invention to provide a tool for extracting integrated circuit packs from printed circuit boards which is more efficient than prior art tools.

It is a further object of this invention to provide a tool for extracting integrated circuit packs from printed circuit boards without damaging the pins of the pack or the integrated circuit chip disposed therein.

It is yet a further of this invention to provide a tool for rapidly extracting an integrated circuit pack from a printed circuit board without damaging the pins of said pack.

It is yet a further object of this invention to provide a tool for desoldering the leads of an integrated circuit pack from an associated conductor or printed circuit board without damaging or short circuiting adjacent conductors.

It is still a further object of this invention to provide a tool capable of removing integrated circuit packs from circuit boards on which other integrated circuit packs are mounted closely adjacent thereto without damaging any of said packs.

These and other objects of the invention are achieved by providing a tool for extracting integrated circuit packs having plural pins along opposed sides thereof from printed circuit boards to which said pins are soldered comprising: a pair of tongs including first and second elongated arms, each arm being pivotable about a first axis and including an electrically heated tip portion mounted thereon, each of said tip portions including hook means, said arms being adapted for rotating about said first axis to cause said tip portions to contact said pins and to cause said tip portions and said hook means to clampingly engage said pack.

Other objects and many of the attendant advantages of this invention will be readily appreciated as the same becomes better understood with reference to the following detailed description when taken in connection with the accompanying drawings where:

FIG. 2 is an exploded perspective view of a portion of the tool shown in FIG. 1;

Referring now in greater detail to the various figures of the drawing wherein like reference characters refer to like parts, an integrated circuit pack extraction tool embodying the present invention is generally shown at 20 in FIG. 1.

Figures 1, 3, 4:
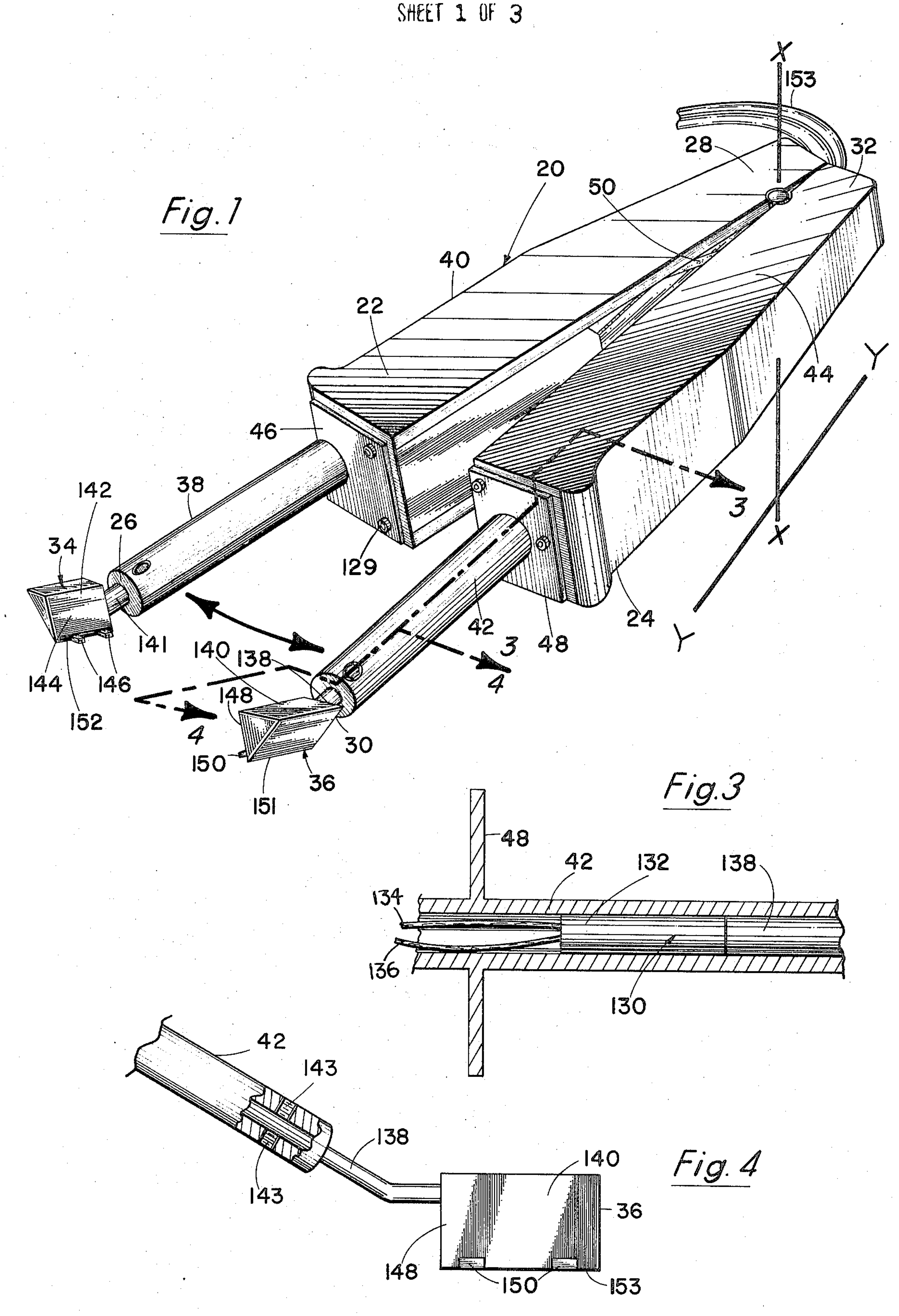
FIG. 1 is a perspective view of a printed circuit pack extraction tool in accordance with this invention.
FIG. 3 is a partial cross-sectional view taken along line 3—3 of FIG. 1.
FIG 4 is a partial cross-sectional view taken along line 4—4 of FIG. 1.
Figure 5:
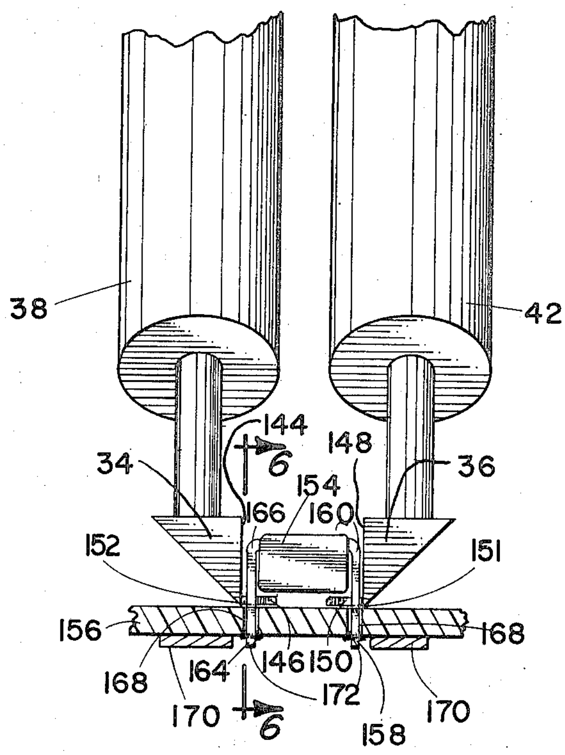
FIG. 5 is a front elevational view of a portion of the tool shown in FIG. 1 removing an integrated circuit pack from a printed circuit board.
Figure 6:
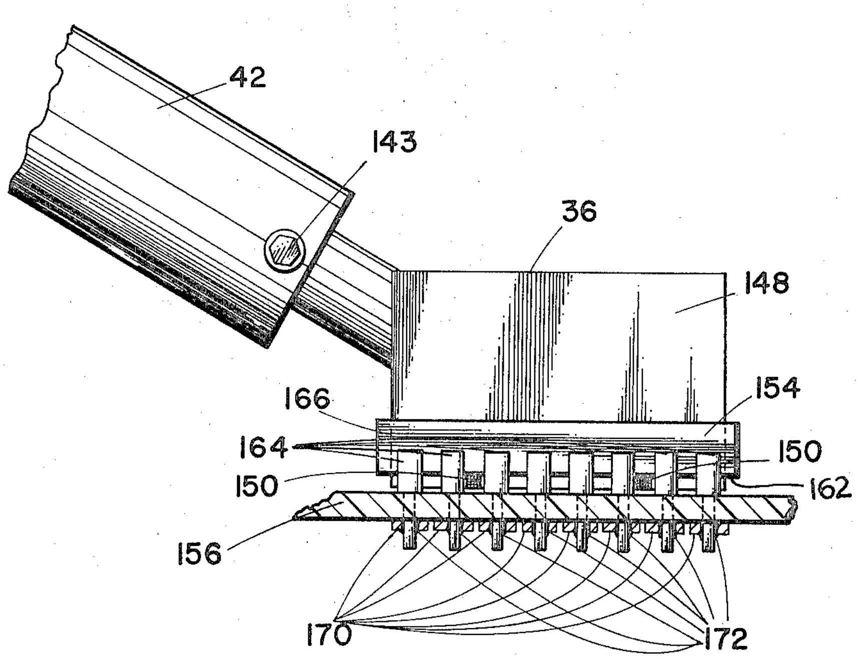
FIG. 6 is a partial cross-sectional view taken along line 6—6 of FIG. 5.

As can be seen therein, tool 20 basically comprises a pair of tongs including a first and second elongated arms 22 and 24. Arm 22 includes a free end 26 and a pivot end 28. Arm 24 includes a free end 30 and a pivot end 32. The arms are coupled to one another at their pivot ends and are pivotable about a first axis X-X. An electrically heated tip member 34 is mounted at the free end 26 of arm 22 and a similar electrically heated tip member 36 is mounted at the free end 30 of arm 24. The tips are provided to clampingly engage the pins of an integrated circuit pack to disolder said pins from a printed circuit board and to extract the pack therefrom when the pins are desoldered.

Arm 22 includes a tubular shaft 38 on which tip member 34 is mounted and a handle 42. In a similar manner arm 24 includes a tubular shaft 42 to which tip member 36 is mounted and a handle 44. Planar heat shields 46 and 48 are provided to mount the shafts 38 and 42, respectively, on handles 40 and 44, respectively, and to thermally shield the handles from said shafts.

The handles are disposed adjacent the respective pivot ends of said arms and are formed of an electrically and thermally insulative material. When the handles are manually gripped and squeezed, the arms 22 and 24 pivot about the axis X-X to move their respective tip members 34 and 36 adjacent to one another.

The tip members are adapted, when the arms are pivoted about axis X-X, for clamping therebetween the plural pins extending along opposed sides of an integrated circuit pack, for heating the pins to desolder them from a printed circuit board to which the pins are soldered and for removing the pack from the board when the pins are desoldered.

A resilient means 50, which will be described in detail later, is provided between the handles 40 and 44 and is connected thereto. The resilient means serves to bias the elongated arms to an open position wherein the tip members 34 and 36 are spaced apart by a distance which is substantially greater than the width of an integrated circuit pack. In FIG. 1 tool 20 is shown in such an open position. The resilient means 50 also serves to oppose the manual force applied to the handles by the user when an integrated circuit pack is being removed from a printed circuit board. This action prevents excessive clamping force from being applied to the pins of the integrated circuit pack, which force may tend to deform the pins.

In the exploded perspective view of FIG. 2 there is shown in detail the construction of the handles 40 and 44, the resilient means 50 for biasing the arms 22 and 24 and means for interconnecting the handles for pivotal movement relative to one another and for mounting the resilient means thereon.

As can be seen therein, handle 40 includes a top-wall portion 52 and a pair of side-wall portions 54 and 56. The top-wall and side-wall portions are formed as an integral unit (e.g. a molded unit). Handle 44 includes top-wall portion 58 and side-wall portions 60 and 62 which are also formed as an integral unit.

Three threaded holes 64 are provided within the end surface 66 of handle 40 and three threaded holes 68 are provided within the end surface 70 of handle 44. The holes 64 and 68 provide the means for effectuating the connection of shafts 38 and 42, and associated planar head shields 46 and 48 to the handles 40 and 44, respectively.

A pair of mesas 72 and 74 extend normally from the interior surface of the top-wall 52 of handle 40. Each mesa includes a threaded hole 76 therein. A similar pair of mesas (not shown) extend normally from the interior surface of the top-wall 58 of handle 44.

A semi-circular groove is provided in the edge of side-wall 54 and a similar groove is provided in the edge of side-wall 56. The grooves are axially aligned normal to the planes of the side-walls. In the cut-away view shown in FIG. 2 neither groove in handle 40 can be seen. Both grooves in handle 44 can be seen in FIG. 2. As shown therein a pair of semi-circular and axially aligned grooves, 78 and 79, is provided in the edges of side-wall 60 and 62 of handle 44.

A flange 80 is provided at the end of top-wall 52 of handle 40 and a similar flange 82 is provided at the end of top-wall 58 of handle 44. The flanges 80 and 82 prevent the user's hand from sliding into contact with the planar heat shields 46 and 48, respectively, when the tool 20 is gripped for use.

The two arms 22 and 24 are connected together for pivotal movement via means disposed within the handles 40 and 44, respectively. As can be seen in FIG. 2 a bottom plate member 84 is provided within handle 40. Plate 84 includes a flat portion 86 having a pair of holes 88 therein. Plate 84 is connected to handle 40 via a pair of screws 90 disposed through said holes and screwed into the threaded portions of mesa 72 and 74. A pair of flat ears 92 are parallely spaced from one another and extend normal to the plane of the flat portion 86. Each ear includes an aperture 94 therein. The apertures in ears 92 are axially aligned with one another and with the semi-circular grooves in handle 40. A similar bottom plate 96 is provided within handle 44 and includes a flat portion 98 having holes 100 therein, through which holes screws 102 pass. The screws are screwed into the threaded holes in the mesas of handle 44. A pair of parallely spaced ears 104 extend normal to the plane of the flat portion 98. Each ear includes an aperture 106 therein. The apertures 106 are axially aligned with one another and with the semi-circular grooves in handle 44. The ears 104 are spaced closer to one another than are the ears 92.

Plate 84 also includes an intermediate portion 108 which extends away from the flat portion 86 at an acute angle thereto and terminates in an enlarged width planar portion 110 disposed within a recess 112 formed in the edges of the side-walls 54 and 56 of handle 40. Plate 96 includes an intermediate portion 113 which extends away from the flat portion 98 at an acute angle thereto and terminates in an enlarged width planar portion 114 disposed within a recess 116 formed in the edges of side-walls 60 and 62 of handle 44.

Handles 40 and 42 are connected together for pivotal movement relative to one another by disposing the ears 104 parallel to and within the space between the ears 92 with their respective apertures 94 and 106 axially aligned. A pivot rod 118 is disposed within said apertures and serves as the axis X-X which the arms 22 and 24 pivot about. The diameter of the pivot rod 118 is somewhat smaller than the diameter of the apertures 94 and 106 to enable arms 22 and 24 to pivot slightly about their longitudinal axes which are normal to the axis X-X. The longitudinal axis is shown as Y-Y.

Resilient means 80 comprises a spring having a pair of angularly biased arms 120 and 122 and is disposed, via its coiled mid-portion 124, about pivot rod 118 when said rod is disposed within the axially aligned apertures 94 and 106. When arranged in this manner, the terminal portion 126 of the spring arm 120 contacts bottom plate 84 of handle 40 and the terminal portion 128 of spring arm 122 contacts the bottom plate 96 of handle 44 to bias said handles in the open condition shown in FIG. 1.

The heat shield plates 46 and 48 are screwed on to handles 40 and 44 via threaded fasteners 129 in their respective threaded holes 64 and 68. In FIG. 3 there is shown a sectional view of the heat shield plate 48 and shaft 42 attached thereto. As can be seen therein shaft 42 is tubular in shape. Disposed within the interior of the tube 42 is a cylindrical electric heating element 130, which according to the preferred embodiment of this invention comprises an electric heating coil (not shown) disposed within a ceramic casing 132. Electrical leads 134 and 136 are connected to respective ends of the heating coil. The electrical leads 134 and 136 extend out of the tubular shaft 42.

Shaft 38 is constructed in an identical manner to shaft 42 and also includes therin a ceramic encased electric heating coil. The leads of the heating element disposed within shaft 38 extend outside the shaft in the same manner as shown in FIG. 3.

The electric heating elements are provided to heat the thermally conductive tip members of tool 20. To that end each tip member includes a shank portion which is disposed within the tubular shaft and which abuts the heating element disposed therein. As can be seen in FIG. 4 tip 36 includes a cylindrical shank portion 138 and a wedge shaped portion 140 both of which are formed of a good thermally conductive material. As can be seen in FIG. 3 shank portion 138 is disposed within tubular shaft 42 and abutting heating element 130. Accordingly, heat generated in the coil of the heating element 130 is conducted through the contiguous surfaces of ceramic casing 132 and shank portion 138 to effectuate the heating of wedge shaped tip portion 140. Tip 34 includes shank 141 and wedge portion 142 and is construed in an identical manner to tip 36. Tip 34 is mounted with its shank portion 141 within shaft 38 and in contact with the heating elements disposed therin. A pair of lock screws are provided in each shaft to lock the shank portion of the tip therein. For example, as can be seen in FIG. 4 shank portion 138 of tip 36 is disposed within shaft 42 and is locked in place by lock screws 143.

Each wedge shaped tip includes a planar surface thereon adaped to communicate with the pins of an integrated circuit pack which is being extraced and hook means which work in conjunction with said planar surfaces for clampingly engaging the integrated circuit pack. As can be seen in FIG. 1, tip 34 includes planar surface 144 and hook means 146 and tip 36 includes planar surface 148 and hook means 150. The hook means are integral with the wedge portion and extend normal to its planar surface and flush with the lower edge of the wedge. For example, a pair of hooks 150 extend normal to the surface 148 of the wedge shaped tip 36 and are flush with the lower edge 151 thereof and a similar pair of hooks 146 extend normal to the surface 144 of the wedge shaped tip 34 and are flush with the lower edge 152 thereof. The shank portions of the tip are angulated such that when the tips are mounted in the shafts and the arms pivoted, the lower edges 151 and 152 thereof align parallel with one another.

The leads for the electrical heating elements in each arm extend through the hollow portion of the associated handle, i.e. portion between the top and side walls thereof and between the bottom plate, and are wrapped about the upstanding mesa portions therein to prevent the leads from falling out of the associated handle. The leads of both handles exit the tool 20 in the form of cable 153. The cable includes an electrical plug (not shown) connected at its end, which is adapted to be inserted into an electrical outlet, whereupon electric current passes through the cable and the leads in the handles to cause the associated heating elements to generate heat and to conduct the same to the associated tips.

Operation of the tool 20 can best be appreciated with reference to FIGS. 1, 2, 5 and 6 and assuming that a dual-in-line integrated circuit pack 154 is to be extracted from a printed circuit board 156 to which its pins have been soldered.

Pack 154 includes plural pins 158 disposed along its longitudinal sidewall 160, which pins extend for a short distance normal there to and then bend at right angles thereto to extend parallel to said-wall for some distance below the plane of the bottom-wall 162 of the pack. Pack 154 also includes plural pins 164 disposed along its longitudinal opposed sidewall 166 which extend for a short distance normal thereto and then bent at right angles thereto to extend parallel to said sidewall distance below the plane of the bottom-wall 162 of the pack. The pins 158 & 164 extend through associated holes 168 which are drilled in the printed circuit board continguous the electrical conductors 170 printed thereon. The pins are soldered to the electrical conductors at the point at which they exit the holes 168. The solered connections are denoted by the reference numeral 172 in FIGS. 5 and 6. As can be seen in those FIGS. when soldered thusly the bottom-wall 162 of circuit pack 154 is spaced slightly above the surface of the printed circuit board 156.

Extraction of the integrated circuit pack 154 from the board 156 is carried out in the following manner. The handles of tool 20 are held in one's hand lightly so that spring 50 maintains the arms of the tool in their open position as shown in FIG. 1. The tool is then moved into the position adjacent the integrated circuit pack 154 to be removed with spaced apart tips 34 and 36 closely adjacent to the side-walls 166 and 160 respectively thereof. The handles 40 and 44 of the tool 20 are the squeezed together the lower edges of the wedge portions align parallel to one another and spaced apart by a distance equal to the distance between the portions of the opposed pins extending parallel to the side-walls of the integrated circuit pack. This action ensures that the edge 151 of tip 36 contacts all of the pins 158 and that the edges 152 of the tip 34 contacts all of the pins 164 such that heat produced in their associated heating elements is conducted to the integrated circuit pack pins to melt the solder by which such pins are connected to the conductors of the printed circuit board.

As previously noted, apertures 94 and 106 of ears 92 and 104, respectively, are larger in diameter than the diameter of the pivot pin 118 passing therethrough, whereby the handles 40 and 44 are enabled to pivot slightly with respect to one another or about the longitudinal axis of their associated arms. This action enables the planar surfaces 144 and 148 of the wedges as well as their respective edges 151 and 152 to align parallel to one another when handles 40 and 44 are squeezed tightly. By virtue of the fact that surfaces 144 and 148 align parallel to one another (as described above) maximum surface contact is made between the heated tip portions of the tool and the integrated circuit pack leads, therby effectuating intimate thermal engagement which results in the rapid and efficient melting of the solder connecting the integrated circuit pack pins to the circuit board conductors. The rapid desoldering of the integrated circuit pins minimizes the chance of molten solder spilling over and short-circuiting adjacent conductors on the printed circuit board. In addition the wedge shaping of the tips enables the tips to get between closely adjacent integrated circuit packs mounted on a circuit board in order to extract one of said packs without effecting the connection between any other packs which may be soldered to the board.

At the same time that surfaces 144 and 148 of tips 34 and 36, respectively, engage pins 164 and 158, respectively, hooks 146 and 150 pass between adjacent pins and between the bottom-wall 162 of pack 154 and the printed circuit board 156 to engage said bottom-wall. The interaction of the surfaces 144 and 148 engaging pins 164 and 158, respectively, and hooks 146 and 150 engaging the bottom-wall 162 of pack 154 between adjacent pins effectively clamps the pack between the tips. As the solder on all the pins is in the process of melting (i.e. becoming desoldered) the tool 20 is rocked slightly back and forth while applying a straight lifting force normal to the plane of the circuit board. When the solder has melted the tool 20 is moved away from the circuit board 156 carrying with it integrated circuit pack 154 which is clampingly engaged between the tips 34 and 36. The rocking action effectively straightens out any pins which may have been deformed to facilitate removal.

Although hooks 146 and 150 are shown being flush with the bottom edge of the wedge shaped tip to which they are attached, such hooks may extend below said edge.

Without further elaboration, the foregoing will so fully illustrate my invention, that others may, by applying current or future knowledge, readily adapt the same for use under various conditions of service.

What is claimed as the invention is:

1. A tool for extracting an integrated circuit pack having plural pins disposed along opposite sides thereof from printed circuit boards to which said pins are soldered, comprising: a pair of tongs including first and second elongated arms, each arm being movable with respect to each other and including an electrically heated tip portion mounted thereon, each of said tip portions including a surface adapted to abut the pins on one side of the pack and hook means projecting from said surface and adapted to fit between adjacent pins on one side of the pack, said arms being movable to cause the surface of said tip portions to contact said pins and to cause said hook means to pass between said pins to contact the underside of said pack to clampingly engage said pack along its sides to enable the extraction of the pack from the board.

2. The tool of claim 1 wherein said arms are each pivotable about a first axis.

3. The tool as specified in claim 2 wherein said tip portions are mounted on said arms at an angle which ensures that when said arms are pivoted about said first axis, the surface of the tip portion of said first arm contacts all of the pins one one side of the pack and the surface of the tip portion of said second arm contacts all of the pins on the opposed side of the pack.

4. The tool as specified in claim 3 wherein said tip portions are wedge shaped.

5. The tool as specified in claim 4 wherein the surface of the wedge shaped tip portion of the first arm is planar and abuts the pins on one side of said pack when said first arm is pivoted about said first axis and wherein the surface of the wedge shaped tip portion of said second arm is planar and abuts the pins on the opposed side of said pack when said second arm is pivoted about said first axis.

6. A tool for extracting an integrated circuit pack having plural pins disposed along opposite sides thereof from printed circuit boards to which said pins are soldered, comprising, a pair of tongs including first and second elongated arms, each arm being pivotable about a first axis and including an electrically heated tip portion mounted thereon, each of said tip portions including a surface adapted to abut the pins on one side of the pack and hook means, said arms also being pivotable through a small arc about a second axis which is substantially normal to said first axis to enable the surface of each tip portion to abut in intimate thermal engagement all of the pins along one side of said pack and enable the hook means to clampingly engage the pack when said arms are pivoted about both of said axes.

7. The tool as specified in claim 6 wherein the tip portions are wedge shaped with the pin engaging surface thereof being planar and wherein said hook means comprise plural fingers extending normally to the planar surface and flush with a lower edge of the wedge portion.

8. The tool as specified in claim 7 wherein each of said arms includes an electric heating means for heating said tip portions.

9. The tool as specified in claim 8 wherein each of said arms includes an electrically and thermally insulative handle.

10. The tool as specified in claim 8 wherein said electrical heating means comprises a heating coil disposed within a ceramic casing.

* * * * *